United States Patent
Solanki

(10) Patent No.: US 6,964,732 B2
(45) Date of Patent: Nov. 15, 2005

(54) METHOD AND APPARATUS FOR CONTINUOUS FORMATION AND LIFT-OFF OF POROUS SILICON LAYERS

(75) Inventor: Chetan Singh Solanki, Leuven (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 3 days.

(21) Appl. No.: 10/670,754

(22) Filed: Sep. 24, 2003

(65) Prior Publication Data

US 2004/0121559 A1 Jun. 24, 2004

Related U.S. Application Data

(63) Continuation-in-part of application No. 09/802,756, filed on Mar. 9, 2001, now Pat. No. 6,649,485.
(60) Provisional application No. 60/417,069, filed on Oct. 8, 2002, and provisional application No. 60/188,347, filed on Mar. 9, 2000.

(30) Foreign Application Priority Data

Mar. 10, 2000 (EP) .......................................... 00870040

(51) Int. Cl.$^7$ .............................. C25F 3/12; C25F 7/00
(52) U.S. Cl. ................. 204/194; 216/99; 438/DIG. 960
(58) Field of Search ................. 216/2, 92, 13, 216/96, 99; 204/194, 279; 438/409, 960; 117/89, 915; 136/258, 261

(56) References Cited

U.S. PATENT DOCUMENTS

| | | |
|---|---|---|
| 5,206,523 A | 4/1993 | Goesele et al. |
| 6,326,280 B1 | 12/2001 | Tayanaka |
| 6,331,208 B1 | 12/2001 | Nishida et al. |
| 6,350,702 B2 | 2/2002 | Sakaguchi et al. |
| 6,649,485 B2 * | 11/2003 | Solanki et al. ............... 438/409 |

FOREIGN PATENT DOCUMENTS

| | | |
|---|---|---|
| EP | 0 226 091 A2 | 6/1987 |
| EP | 0 797 258 A2 | 9/1987 |
| EP | 0 975 012 A2 | 1/2000 |

OTHER PUBLICATIONS

Solanki et al., "Thin Monocrystalline Silicon Films for Solar Cells," May 2003, 3rd World Conference on Photovoltaic Energy Conversion, pp. 1320–1323.*

Bender, et al., "Morphological properties of porous–Si layers for $n^+$–emitter applications", Applied Surface Science, vol. 47, pp. 187–200), (1999).

Billat, et al., "Influence of etch stops on the microstructure of porous silicon layers", Thin Solid Films, vol. 297, pp. 22–25, (1997).

(Continued)

*Primary Examiner*—Evan Pert
(74) *Attorney, Agent, or Firm*—Knobbe Martens Olson & Bear LLP

(57) ABSTRACT

A method and apparatus for slicing a semiconductor substrate. In one embodiment, the invention allows repetitive etching of a surface of the semiconductor substrate with a time dependent concentration of fluorine ions and a time dependent current I, such that multiple porous layers are obtained. The porous layer is released, and the released porous layer is removed from the surface of the substrate. The surface roughness of the porous layer is maintained within an acceptable or desired level of roughness value. The invention also provides an apparatus including a container having an etching solution. The semiconductor substrate may be protected by a tube covering at least a potion of said semiconductor substrate from said etching solution. The rate of insertion of said semiconductor substrate into the container is controlled to synchronize the lift-off with the insertion of the correct thickness of the semiconductor substrate. The anodising current is provided between two electrodes during operation.

21 Claims, 14 Drawing Sheets

OTHER PUBLICATIONS

Ookubo, et al., "Microscope observation of a self-standing film of porous silicon", Materials Science and Engineering, vol. B20, pp. 324–327, (1993).

Rinke, et al., "Quasi-monocrystalline silicon for thin-film devices", Applied Physics A, 68, pp. 705–707, (1999).

Tayanaka, et al., "Thin-film crystalline silicon solar cells obtained by separation of a porous silicon sacrificial layer", $2^{nd}$ Wold Conference and Exhibition on Photovoltaic Solar Energy Conversion, Vienna, Austria, 1272 (Jul. 6–10, 1998).

European Search Reports for European Application No. EP 00 87 0040, dated Aug. 28, 2000.

Solanki, et al., Effect of the composition of electrolyte on separation of porous silicon film by electrochemical etching, Phys. Stat. Sol. (a) 197 (2), pp. 507–511, May 26, 2003, Wiley–VCH Verlag GmbH & Co., KGaA, Weinheim.

Bilyalov, et al., Role of hydrogen in the separation of a porous Si layer in a layer transfer process, Phys. Stat. Sol., (a) 197 (1), pp. 128–131, Apr. 29, 2003, Wiley–VCH Verlag GmbH & Co., KGaA, Weinheim.

Solanki, et al., Development of solar cell processes for free-standing thin silicon films, Physics of Semiconductor Devices, pp. 1145–1147, 2004 Narosa Publishing House, New Delhi, India.

Solanki, et al., Transfer of a thin silicon film on to a ceramic substrate, Thin Solid Films 403–404, pp. 34–38, 2002 Elsevier Science B.V.

Solanki, et al., Free–Standing Thin–Film Monocrystalline Silicon (FMS) Solar Cells, PV in Europe–From PV Technology to Energy Solutions, pp. 387–392, Oct. 7–11, 2002, Rome, Italy.

* cited by examiner

PRIOR ART

METHOD AND APPARATUS FOR CONTINUOUS FORMATION AND LIFT-OFF OF POROUS SILICON LAYERS

RELATED APPLICATIONS

This application is a continuation-in-part, and hereby claims priority to and incorporates by reference the entire disclosure, of U.S. patent application Ser. No. 09/802,756, entitled "METHOD FOR THE FORMATION AND LIFT-OFF OF POROUS SILICON LAYERS", filed on Mar. 9, 2001 now U.S. Pat. No. 6,649,485, which claims priority to U.S. Provisional Application No. 60/188,347, filed on Mar. 9, 2000 and to EP Application No. 00870040.3 filed Mar. 10, 2000.

This application further claims priority to, and hereby incorporates by reference the entire disclosure of, U.S. Provisional Application No. 60/417,069, entitled "METHOD FOR THE CONTINUOUS FORMATION AND LIFT-OFF OF POROUS SILICON LAYERS", filed on Oct. 8, 2002.

BACKGROUND OF THE INVENTION

1. Field of the Invention

The present invention relates generally to the field of micro-electronics. More particularly, this invention relates to the formation of porous silicon layers (PSL) and their lift-off in the manufacture of Silicon On Insulator (SOI) structures in the fabrication of photovoltaic cells.

2. Description of the Related Art

When manufacturing a solar cell, the top few microns of a silicon wafer actively participate in the conversion of solar energy. Most of the expensive silicon wafer provides mechanical strength to the cell. This function can be achieved by other low-cost substrates compatible with the solar cell fabrication process. Thus cost reduction may be achieved by providing a reduction in the use of silicon.

Silicon on insulator (SOI) structures are known in the art, for example in the manufacture of low-cost solar cells with high efficiency. Some of the advantages are prevention of latch-up, low parasitic capacitance, high-speed operation and the absence of a need for a welling process.

In general, FIGS. 1A, 1B, 1C, 1D, 1E, and 1F illustrate a prior art technique for the formation of a porous layer and its separation from the substrate. Generally, the formation and transfer of PSLs to other substrates involve the following steps:

Formation in a silicon substrate 1 of a low porosity layer 2 on the surface and a high porosity layer 3 thereunder by anodisation of silicon in hydrofluoric acid by changing the current density during the PSL formation.

Formation of a separation layer under the high porosity layer by high temperature annealing in hydrogen. This separation layer is a highly porous layer and is mechanically very weak. It can easily be broken by little mechanical force, e.g. by ultrasonic treatment or pulling.

Bonding of the obtained structure to another substrate using an adhesive.

Formation techniques have been discussed by H. Tayanaka et al., $2^{nd}$ world conference and exhibition on photovoltaic solar energy conversion, Vienna, Austria, 1272 (1998), and by T. J. Rinker et al., Applied Physics A, 68, 705–707 (1999), the entirety of each is incorporated herein by reference.

Another approach, disclosed by T. Yonehara et al. in Electrical Society Proceedings, Volume 99-3, 111, uses mechanical grinding, selective etching and hydrogen annealing for transferring thin silicon epi layers on the other substrate, the entirety of which is incorporated herein by reference. The European patent application EP 0867920 discussed the use of a laser beam for the separation of the thin layer from the silicon substrate, the entirety of which is incorporated herein by reference.

In U.S. Pat. Nos. 5,778,869 and 4,465,550, methods and apparatuses are described for slicing solid materials, especially semiconductor ingots, the entirety of each are incorporated herein by reference. These methods create kerf loss, need expensive equipment, are limited to removal of thick film layers, e.g., greater than 50 μm. Thus, there is a need in the art for a method and apparatus for the formation of substrate layer while minimizing the loss of substrate material as for instance kerf loss.

SUMMARY OF THE INVENTION

To overcome the problems of the prior art, the invention provides a method of slicing a semiconductor substrate. In one embodiment, the method comprises applying N times, where N is a finite number, the process of etching a surface of said semiconductor substrate with a time dependent concentration of F– $F^-(t)$, and a time dependent current I, $I(t)$, such that $([F^-,I]_i (t), i=1,2,\ldots, N)$ wherein 'i' identifies a porous layer, until a porous layer having surface roughness SR(i) is formed and said porous layer is released from said substrate. The method further comprises removing the released porous layer i from the surface of said substrate, wherein SR(i) is maintained below a desired threshold level.

In another embodiment, the invention provides an apparatus for the slicing of a semiconductor substrate. The apparatus comprises a container comprising at least one of first, second, third, and fourth holes, and an etching solution contained within said container. The apparatus further comprises an isolating material configured to protect at least a portion of said semiconductor substrate from said etching solution upon insertion into said container through said first hole and after exposing said substrate to said etching solution. The apparatus further comprises a controller configured to regulate insertion of said semiconductor substrate into said container and said etching solution. The apparatus further comprises an extractor configured to remove said released layer from said container via said second hole. The apparatus further comprises a first electrode connected to an unexposed portion of said substrate, and a second electrode located in said etching solution. The apparatus further comprises a voltage source configured to apply a voltage between said first and second electrodes.

In yet another embodiment, the invention provides a method of slicing a semiconductor substrate, the method comprising applying a time-dependent current to a surface the semiconductor substrate that is immersed in a solution having a controlled concentration of F—. The method further comprises releasing a layer from the semiconductor substrate in response to the application of the time-dependent current for a period of time. The method further comprises repeating the applying and releasing steps using the same values of time-dependent current and concentration of F–.

DETAILED DESCRIPTION OF THE INVENTION

In relation to the appended drawings the present invention is described in more detail below. Several embodiments are disclosed. It is apparent however that a person skilled in the art can recognize several other equivalent embodiments or other ways of practicing the present invention, the spirit and scope thereof being limited only by the terms of the claims.

In one embodiment, the present invention provides a technique of formation and lift-off (separation) of thin film from the substrate. With this approach the remaining wafer (after removing thin layer) can be used again as starting product for manufacturing more thin films.

In one embodiment, the invention of formation and separation of PSL may be implemented with a single step as compared to multiple, complex steps required in other existing approaches. Porous silicon layers are formed by anodization, which is the electrochemical etching of silicon in the solution based on hydrofluoric acid. If one carries out the anodization for a sufficient time and for a given current density, pores travel straight down in the silicon. When a certain pore depth is reached, the concentration of fluoride at the point of the reaction decreases. Branching of the pores gives rise to the separation layer. The separated layer can be used for any desired use. Thus, in this way, one can avoid the following steps of the formation and separation of thin film from the substrate:

(a) No replacement of the solution comprising F— ions is required.
(b) No change in the current density is required for forming double porosity structure.
(c) No high temperature annealing in hydrogen is required for making the separation layer.
(d) No mechanical force is required to separate the layer from the substrate.

Another approach, which provides better control over the separation of the layer from the substrate, involves two steps. In the first step one carries out the electrochemical etching as stated above and in the second step one exploits an electro-polishing regime for the formation of the separation layer.

Embodiment(s) of the invention are described by reference to examples 1 to 4. The example 1 describes the set-up used for the porous silicon formation. Porous silicon formation and its separation from the reusable substrate by electrocheniical etching are described in example 2. A formation mechanism of a separation layer or a detached layer is described in example 3. In example 4, the electrochemical reaction is limited by the fluoride ions in the solution, known as electro-polishing. The combination of electrochemical etching and electro-polishing with certain conditions can be used for the PSL and its separation from the reusable substrate.

EXAMPLE 1

Experimental Setup

Figure 1A:
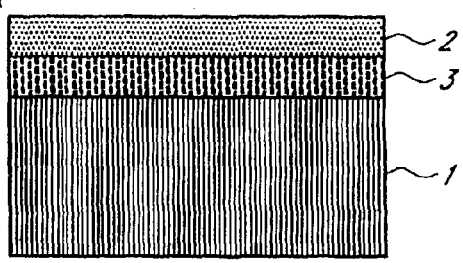
FIGS. 1A, 1B, 1C, 1D, 1E and 1F illustrate the prior art technique and shows the steps used for the formation of porous layer and its separation from the substrate.
Figure 1B:
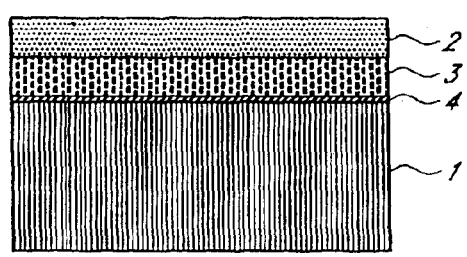
Figure 1C:
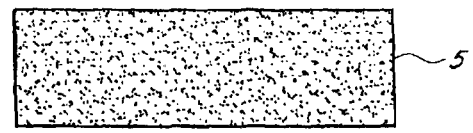
Figure 1D:
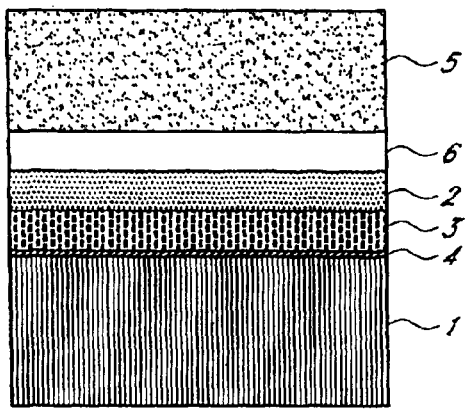
Figure 1E:
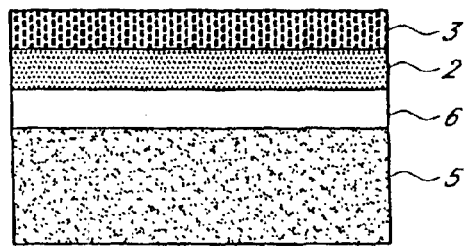
Figure 1F:
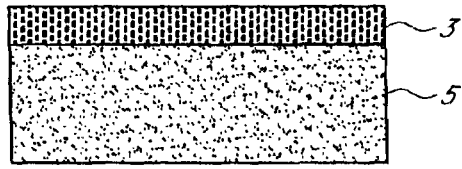
Figure 2:
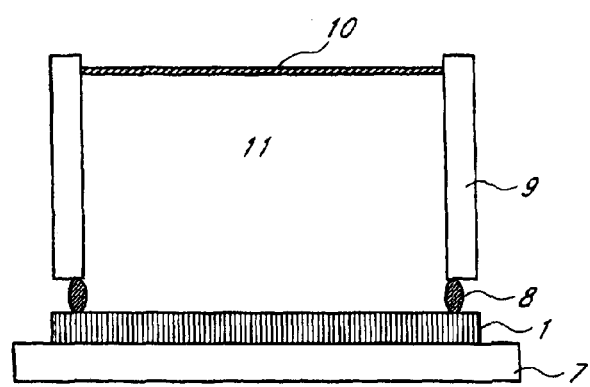
FIG. 2 illustrates the experimental set-up.

FIG. 2 illustrates the experimental set-up used for the porous silicon layer formation. Reference numeral 11 is the hydrofluoric acid solution. In the porous silicon formation the platinum electrode 10, which is resistant against hydrofluoric acid, acts as a negative electrode. The bottom plate 7 (e.g. stainless steel plate), which is in contact with the silicon wafer 1 (polished side up), acts as cathode. The rubber ring 8 prevents the outflow of the solution from the contact area of the Teflon® beaker 9 and wafer substrate 1. The rubber ring 8 is kept under pressure by the beaker 9, which in turn is pressurised by a stainless steel threaded ring (not shown).

EXAMPLE 2

Figure 3A:
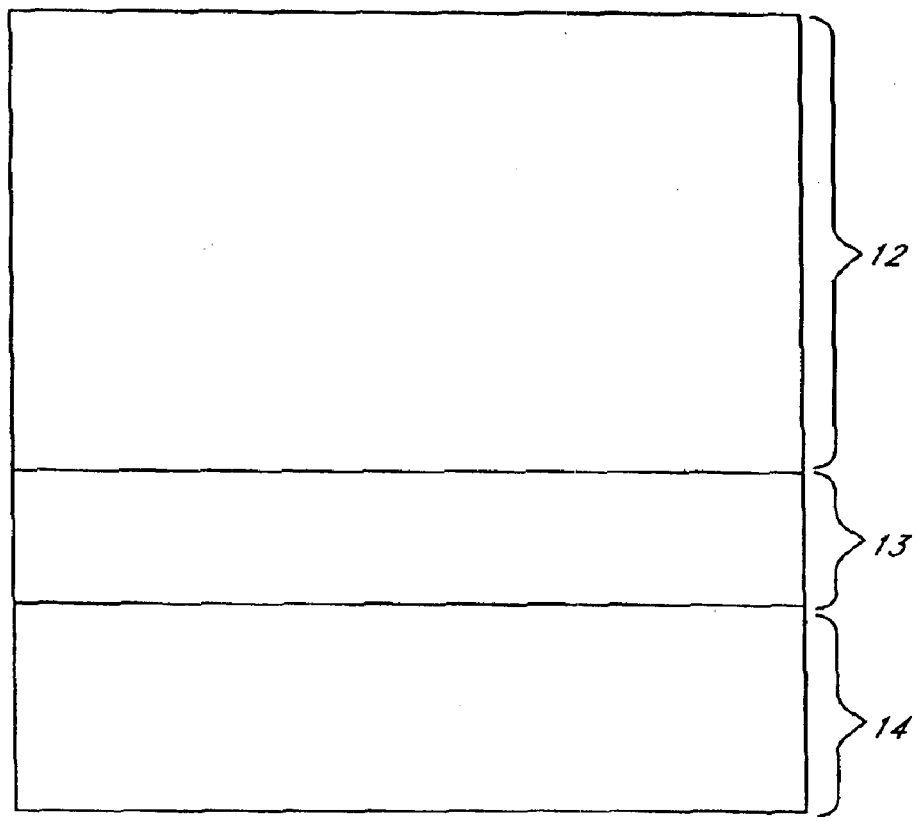
FIGS. 3A and 3B respectively are pictures of the interface between bulk silicon and porous layer just before separation and of the pore structure.
Figure 3B:
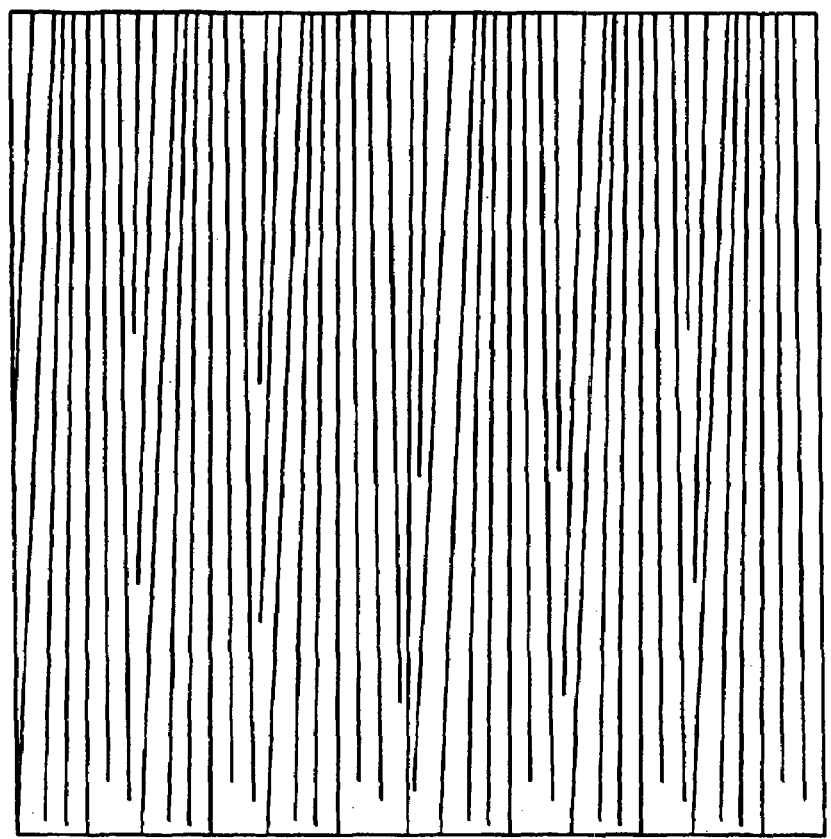

Experiments were carried out with a mixture of HF, acetic acid and deionised water in which the concentration of HF varies between the different experiments from 10% to 40% and current density varies from 25 mA/cm$^2$ to 200 mA/cm$^2$. The acetic acid is used as a wetting agent, and provides enough functionality to obtain a good pore distribution. Ethanol could also be used, but for environmental reasons acetic acid is preferred. For a given current density and for a given HF concentration, formation of the separation layer or a very high porosity layer or a detached layer as shown in FIG. 3A is obtained when the reaction is continued after a certain time. The low porosity layer 12, high porosity (separation) layer 13 just before lift-off and silicon wafer substrate 14 are visible on FIG. 3A. For a 25% HF solution and for 150 mA/cm$^2$ current density this time is around 45–55 second and the thickness of the thin layer obtained is around 7 to 10 microns. Different layer thickness can be achieved by changing the current density and HF concentration in the solution. During the etching the pore extends downward in the silicon wafer as shown in FIG. 3B. Pores are not perfectly cylindrical in shape. For all experiments highly doped silicon wafers of orientation <100>were used.

EXAMPLE 3

Electrochemical etching of silicon occurs at the HF solution/silicon interface when subjected to the flow of current. When a hole coming from the bulk silicon reaches to the interface, the Si—H bonds is replaced by Si—F bond due to an attack by a fluoride ion from the HF solution. The polarization induced by these Si—F bond lowers the electron density of the Si—Si bond and these are broken too. Silicon dissolves as tetravalent silicon fluoride (SiF$_4$), which reacts with HF and produces fluorosilicic acid (H$_2$SiF$_6$).

Figure 4:
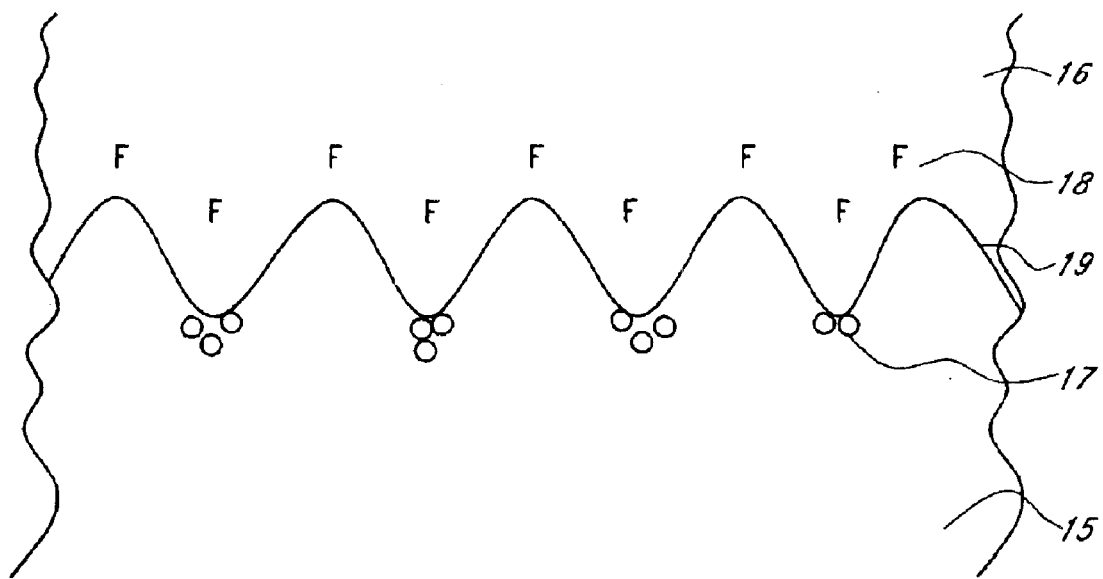
FIG. 4 illustrates the electrochemical etching reaction at the interface of the HF solution and silicon.

This electrochemical reaction is limited to the holes and results in pore formation. FIG. 4 illustrates the interface between bulk silicon and the HF solution where pore formation occurs. The numeral 15 indicates bulk silicon, 16 is the HF solution, 17 designates the holes, 18 are the fluoride ions and 19 is the interface.

Once the pore formation starts at a certain position, it goes straight down in silicon as shown in FIG. 5. The numeral 21 indicates bulk silicon, 22 indicates pores and 23 indicates the point of reaction. When the pores are not deep enough the reaction occurs at the bottom of the pore as shown in FIGS. 5A and 5B. At this time, there are sufficient fluoride ions available at the bottom but certainly less than the number of fluoride ions available at the surface since they have to diffuse through the pore to the point of reaction. Porosity of the layer increases with decrease in the concentration of HF in solution. Although the initial $F^-$ containing solution is not replaced, an in-situ change of concentration is obtained. Therefore as we go deeper, porosity of the layer increases. The porosity gradient occurs from the point where the availability of the fluoride ion is affected by the diffusion through pores.

Figure 5A:
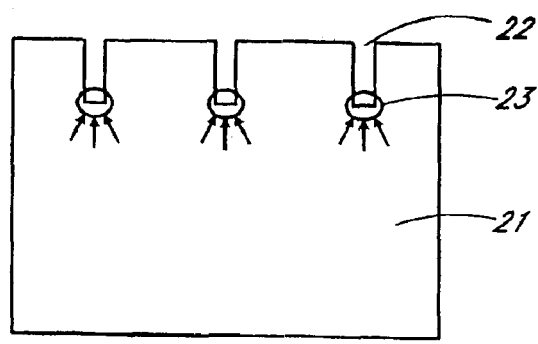
FIGS. 5A to 5D illustrate the porous silicon layer formation and its separation mechanism from the reusable substrate.
Figure 5B:
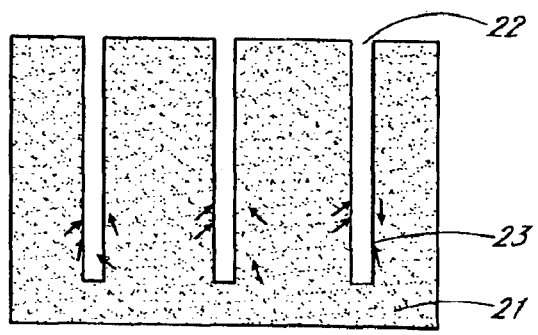
Figure 5C:
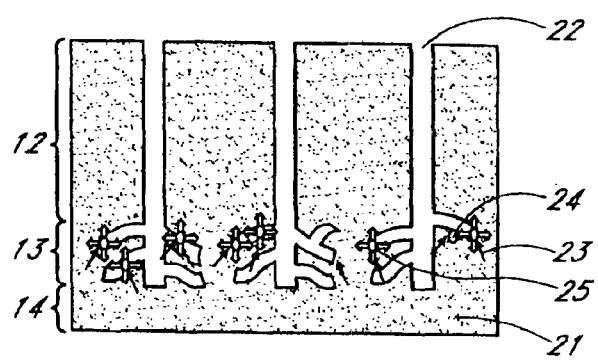
Figure 5D:
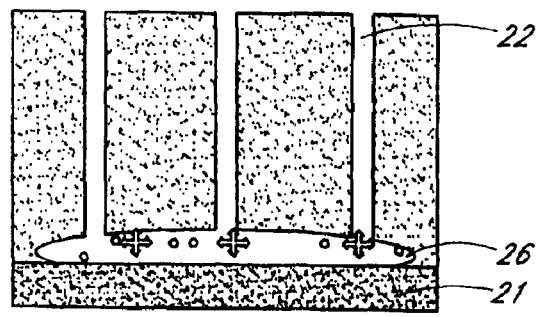

As pores go sufficiently deep in silicon, the fluoride ion concentration at the point of reaction reduces to a very low level as compared to the surface concentration. This results in the shift of the point of reaction to a slightly higher level because of very high resistance of the lowest part of the pore as shown in FIGS. 5C and 5D. This shift in the reaction gives rise to the formation of the branches of the pores as shown in FIGS. 5E and 5F. In FIG. 5E the numeral 24 indicates a hydrogen molecule and 25 is the direction of the hydrodynamic force exerted by the molecule. For every dissolution of a silicon atom, one hydrogen molecule results as a product of the electrochemical etching. The hydrogen molecules exert force on the walls of the pores. At some points, because of the branching of pores the walls becomes very thin and not able to withstand the hydrodynamic pressure exerted by the hydrogen molecules. This results in horizontal cracks 26 in the layer. The presence of sufficient horizontal cracks results in the separation of the layer from the substrate. The layer can then detach from the substrate as shown in FIGS. 5G and H.

EXAMPLE 4

For the case of 25% HF solution and 150 mA/cm$^2$ current density the separation of the PSL occurs at around 45–55 seconds. Because of the high current density, reaction occurs very fast. The centre portion of the layer gets detached with the wafer but the periphery remains attached with the silicon because of the construction of the experimental set-up. Therefore after the formation of separation layer if the reaction is allowed to continue, the by-product, hydrogen, gathers underneath the layer and exerts pressure on the film. The film breaks because of this pressure. Therefore, exact control of the reaction is required.

In another approach, which comprises two steps, one can exploit the use of electro-polishing together with the electrochemical etching for the formation of separation layer. For the purpose of this invention, polishing shall be understood as etching a rough surface such that the uneven topography of the surface decreases. Electrochemical etching is carried out with the set-up described in example 1. In the first step one forms porous silicon layer and in the second step changing the solution from high concentration to low concentration of $F^-$ results in electro-polishing. For example in the first step one uses 25% HF and 150 mA/cm$^2$ current density during 45 seconds. For the second step one uses a solution of low HF concentration, for example 17%. The reaction at the interface is limited by the fluoride ion concentration and electro-polishing at the interface of bulk silicon and porous layer occurs. The time required to form a separation layer in the second step varies from 60 seconds to 80 seconds. This electro-polishing effect can also be obtained by keeping the same solution, but changing (augmenting) the current.

In yet another approach, one can control the reaction that occurs at the deepest porous layer in such a way that no horizontal cracks occur. This can e.g. be done by halting the current for a short period just before the time that separation would normally occur, and then applying the current again for a short period. By doing this repeatedly, one can obtain high-thickness porous layers easily. A thickness of 70 $\mu$m is readily obtainable. Applying the current for a sufficient amount of time for horizontal cracks to occur can easily separate such thick porous layers from the substrate. Pausing the application of current allows the hydrogen to escape from the pores and can thus postpone the formation of horizontal crack due to hydrogen pressure.

In one embodiment, a constant current and concentration of etching solution are used. The present invention provides a remaining wafer (after removing a first thin layer) which can be used again as starting product for manufacturing more thin films.

Other techniques include performing different steps to produce a transferable porous layer. Each of these different steps can be characterised by a specific concentration of etchant, such as HF, and a specific electrochemical etching current.

Moreover a time dependent electrochemical etching current and/or a time dependent etchant concentration are possible.

As described above an example is provided which provides a better control over the separation of the layer from the substrate, and comprises two steps. In the first step one carries out the electrochemical etching and in the second step one exploits an electro-polishing regime for the formation of the separation layer.

After separation of porous silicon film from the original substrate the concentration of HF resumes to initial condition on the surface of the remaining silicon substrate. If the application of anodic current is not hindered, formation of porous silicon continues at the surface of remaining silicon and separation of another porous silicon film can be obtained. In principle this process of resumption of HF at the surface of remaining silicon substrate, formation of porous silicon and separation of the porous film can go till the entire wafer is used up. Instead of a silicon wafer, one may use a one-meter long silicon ingot (as shown in for instance FIG. 6), out of which for instance 50,000 porous silicon films of about 20 $\mu$m thickness can be obtained without loosing material in the form of kerf loss. Wire sawing techniques, typically used for cutting substrates from an ingot, introduce a high level of kerf loss.

In one embodiment, the invention provides such an advantage of re-using the same silicon substrate several times because the remaining silicon substrate retains good surface quality after one or more PS film separations. In particular, it is desirable to maintain the Si substrate surface roughness low. A deteriorated surface may result in a defective epitaxial layer.

FIGS. 10a–10e illustrate the evolution of the roughness for consecutively produced thin films. Atomic Force Microscopy (AFM) is used to study the roughness of the Si substrate surface after one or more lift-offs. A substrate surface represents the surface of the porous film being separated, which acts as a base for a subsequent epitaxial layer deposition. Therefore, it is desirable to study the substrate surface, instead of the surface of a free-standing and separated film. This is especially beneficial because the PS formation increases the roughness only by less than 1 nm, while analyzing free-standing films is troublesome.

Starting with the polished silicon substrate, the surface roughness, first, increases on formation of PS and increases further as a result of the PS film separation. Indeed, the separation of the PS film from the substrate occurs from a high porosity layer, which is expected to be rougher. In order to study the substrate surface roughness behavior after multiple film separation, a set of experiments has been performed for both OSS (One step Separation) and TSS (Two step separation) methods. The results of the study are summarized in Table 1. For the OSS the following set of parameters was used: 16% HF (80:170:: HF:CH3COOH, a constant current of 75 mA/cm2; automatic film separation appears after 150 sec.) For the TSS the following set of parameters was used: 16% HF (80:170:: HF:CH3COOH) in a 1st step: a current of 50 mA/cm2 for 150 sec, and in the $2^{nd}$ step a current ranging from about of 50 to 250 mA/cm2 in increasing current increments of about 20 mA/(cm2. sec). Separation occurred when the current reached to an amplitude of 85 mA/cm2.

face of a free-standing PS film, study of remaining substrate surface is equally valid.

Electropolishing of the substrate surface after the lift-off is studied with the purpose that, if the substrate surface roughness increases to an unacceptable level, the smoothing of the surface can be achieved with electropolishing. Electropolishing of the Si substrate can be carried out without additional effort, since it requires same experimental set-up and parameters (Electrolyte containing HF and current supply) as that of PS formation, but different magnitudes.

Figure 10A:
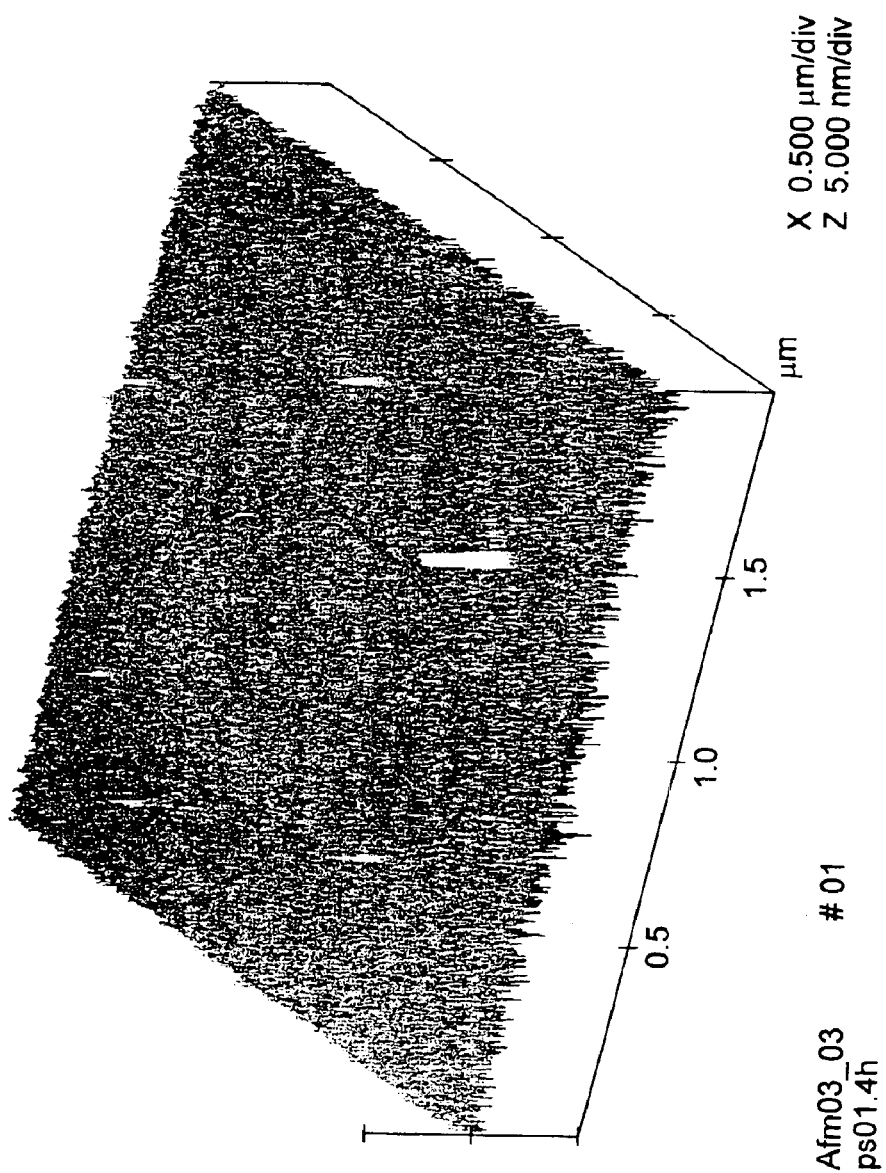
FIGS. 10(a), 10(b), 10(c), 10(d), 10(e) and 10(f) show AFM micrographs of a Si substrate surface (a) with a porous silicon layer formed on a polished substrate; (b) after 1 PS film lift-off or separation; (c) after 2 PS film lift-off; (d) after 3 PS film lift-off; (e) after 5 PS film lift-off; and (f) a two-dimensional graph illustrating surface roughness versus 'number of lift-offs', respectively.
Figure 10B:
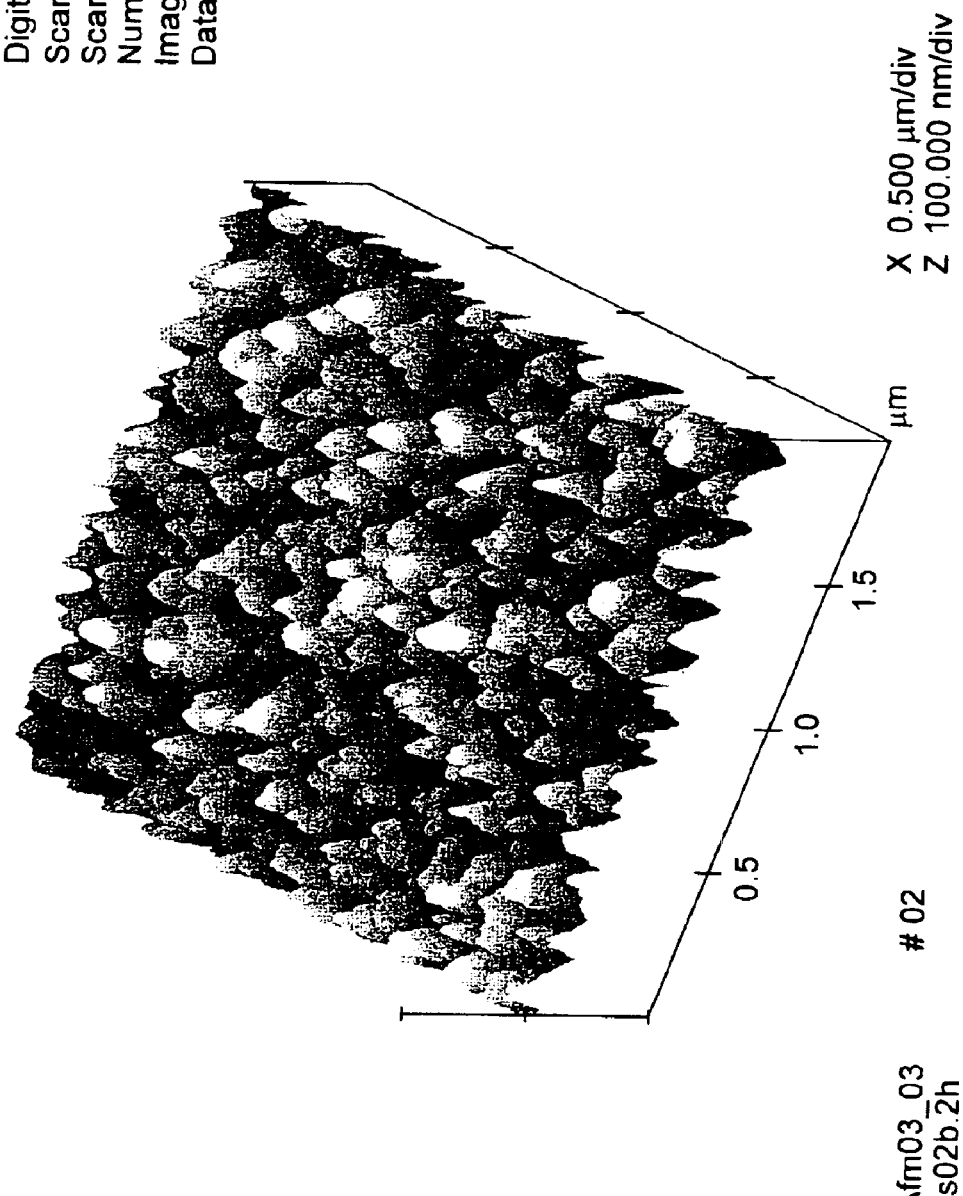
Figure 10C:
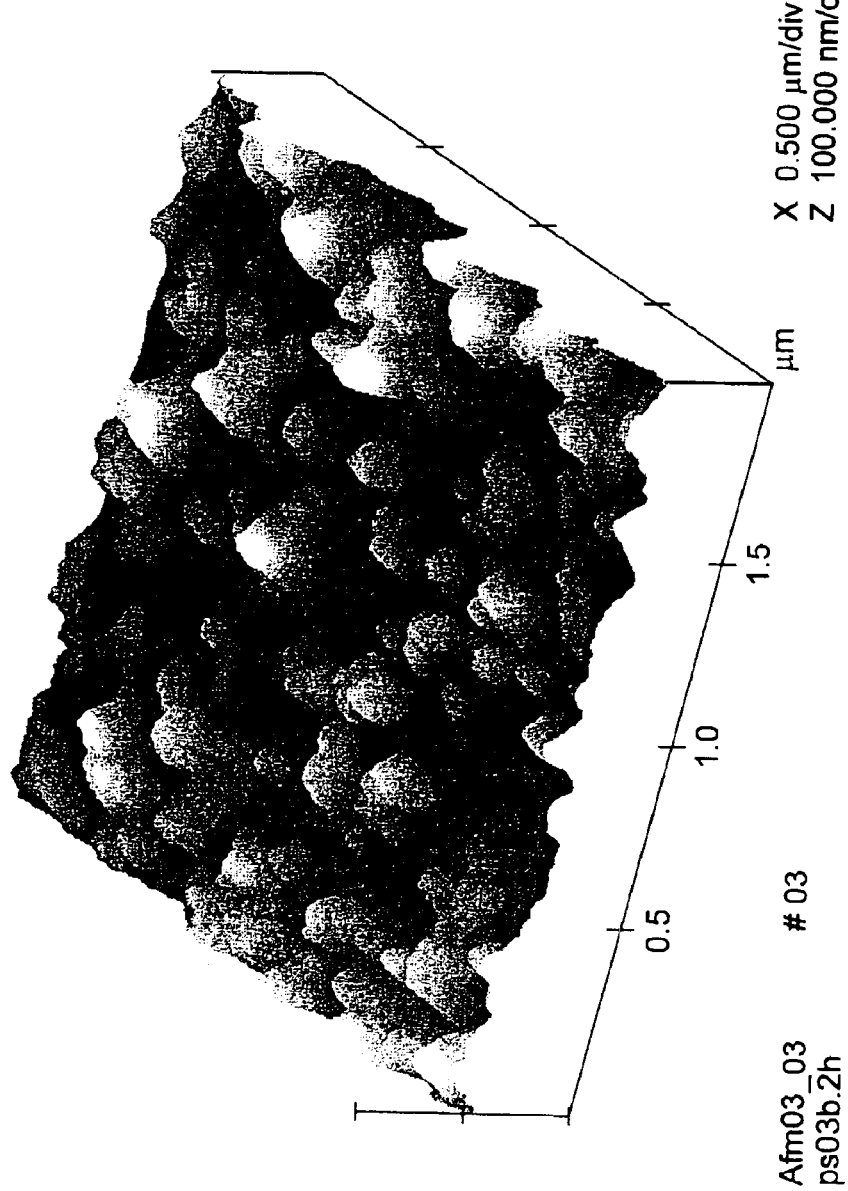
Figure 10D:
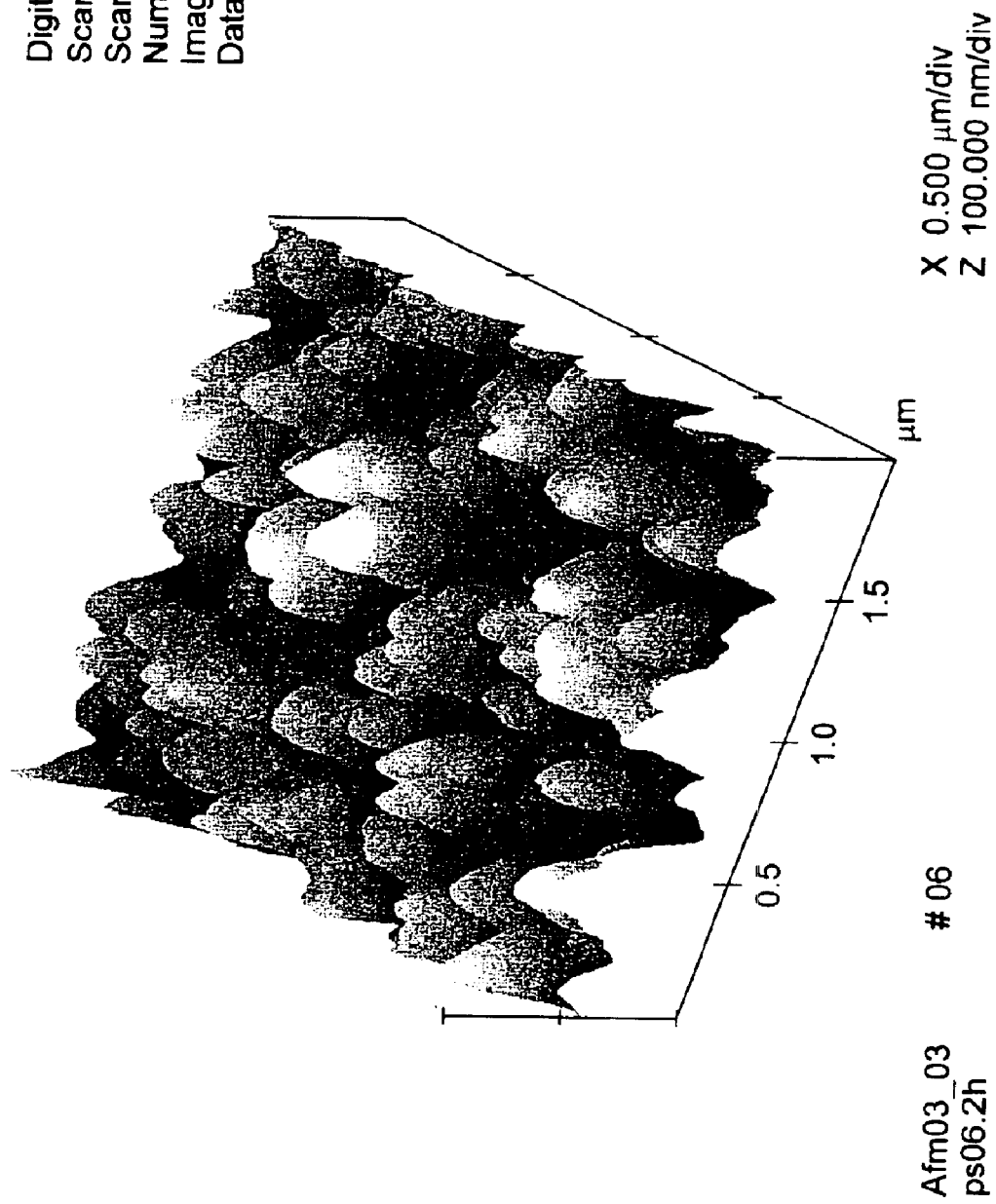
Figure 10E:
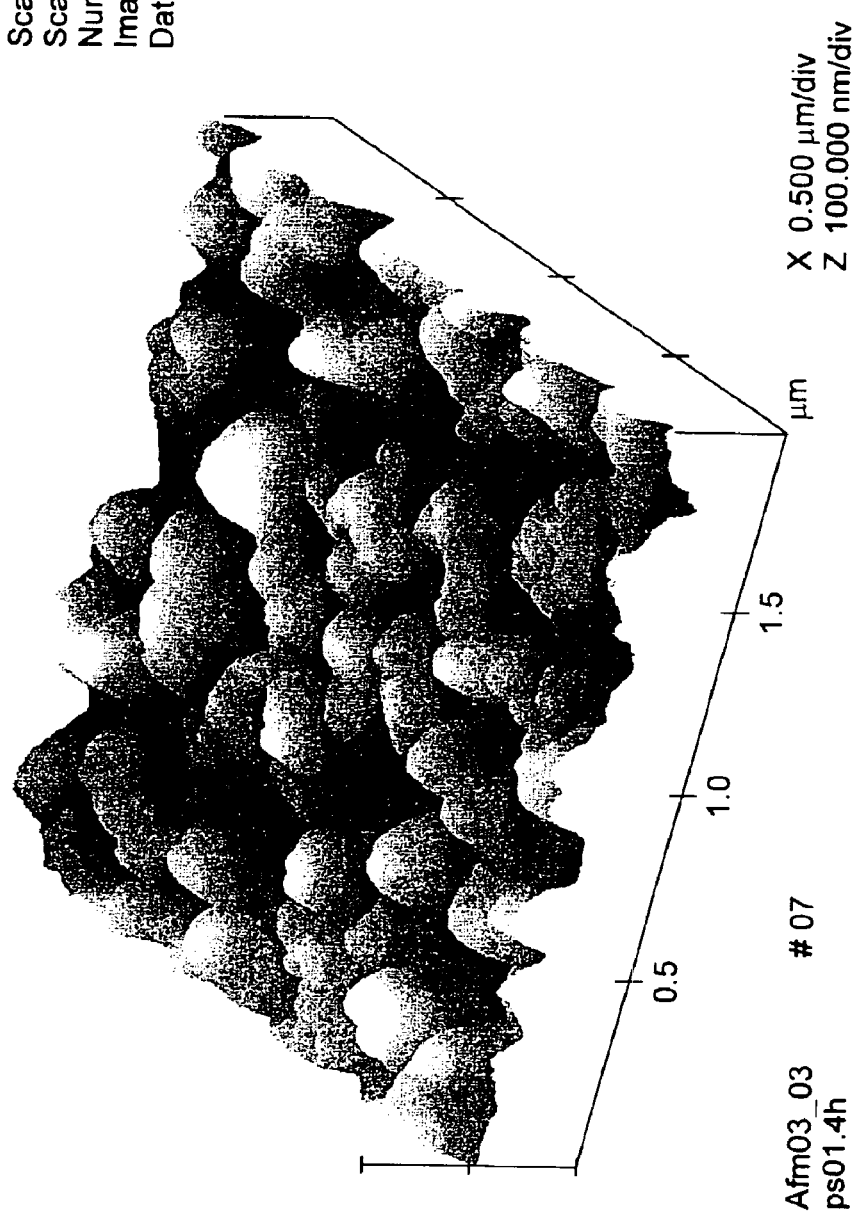
Figure 10F:
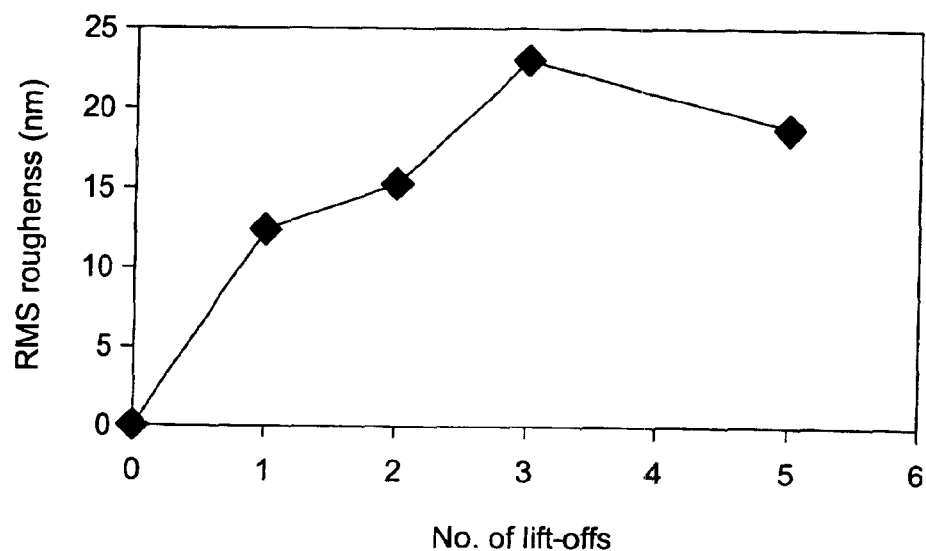

The AFM micrographs of the Si substrate surfaces after one and more lift-offs, using OSS method, are shown in FIG. 10, from (a) to (e), and the trend of the substrate surface roughness variation with respect to 'number of lift-offs' for which the substrate has been used prior to roughness measurements is presented in FIG. 10(f). Since the separation of the PS film occurs from the high porosity layer containing the pores with diameters up to 60 to 80 nm, the surface after the first PS film lift-off is expected to be rougher than the starting surface roughness. It can be seen from FIG. 10(f) that the substrate surface roughness (RMS value) increases with the 'number of lift-offs'. But the roughness does not increase indefinitely with the 'number of lift-offs', and the roughness appears to converge to a value of about 20 nm after 3 to 4 lift-offs.

The remaining substrate surface roughness appears to be independent of 'number of lift-offs', which is manifested in FIG. 10(f). Since each PS film separation occurs from the

| | Sample No: | Sample surface history (number of lift-off) | | | | | Final surface treatment | AFM surface roughness RMS (nm) |
|---|---|---|---|---|---|---|---|---|
| | | 1 | 2 | 3 | 4 | 5 | | |
| OSS method | O1 | | | | | | PS formation polished surface | 0.33 |
| | O2 | ■ | | | | | — | 12.38 |
| | O3 | ■ | | | | | Porous silicon formation | 13.50 |
| | O4 | ■ | ■ | | | | — | 15.24 |
| | O5 | ■ | ■ | ■ | | | — | 24.21 |
| | O6 | ■ | ■ | ■ | ■ | | — | 18.67 |
| TSS method | T1 | ■ | | | | | — | 4.09 |

Tab.1: Study of Si Substrate Surface Roughness After Multiple Porous Silicon Film Separation Performed for Both OSS and TSS Method The third column in the Table 1, having the heading 'sample surface history', presents the number of times the sample was used to lift-off a PS film before analysis. The surface roughness was measured on the surface of the as-prepared substrate immediately after lift-off, after PS formation. The substrate surface roughness immediately after a single lift-off, and after porous silicon formation on the lift-off surface, was measured and compared (see, e.g., sample O2 and O3. It can be seen from Table 5-1 that on PS formation, the roughness increases from 12.38 to 13.50 nm. This supports the proposition that instead of studying surhigh porosity layer and it is the feature of the high porosity layer (how slow or fast transition from high porosity to 100% porosity, from where the PS film separates) that determines the micro level roughness of the remaining Si substrate, which is controlled by the PS formation parameters, current density and HF concentration. Moreover, the thickness of the free-standing film is homogeneous across the entire film area, and the macro level roughness of the substrate also remains the same with the more PS film list-offs. Surface roughness of 20 nm is in the acceptable range for depositing good quality epitaxial layers.

It is believed that additional steps in the electropolishing regime can improve surface roughness or can change the convergence value for the surface roughness if the same set of currents and concentrations are applied repeatedly. In one embodiment, the repeated application of same set of currents and concentrations can be applied to any type of lift-off process, including those processes described in U.S. Pat. No. 6,326,280 issued to Tayanaka and U.S. Pat. No. 6,350,702 issued to Sakaguchi et al., the entire disclosure of each is incorporated herein by reference.

It can be seen from Tab. 1 that a repetition of the same TSS step has the potential to converge to a surface roughness value that is smaller than that of a repetition of the same OSS step.

Figure 6:
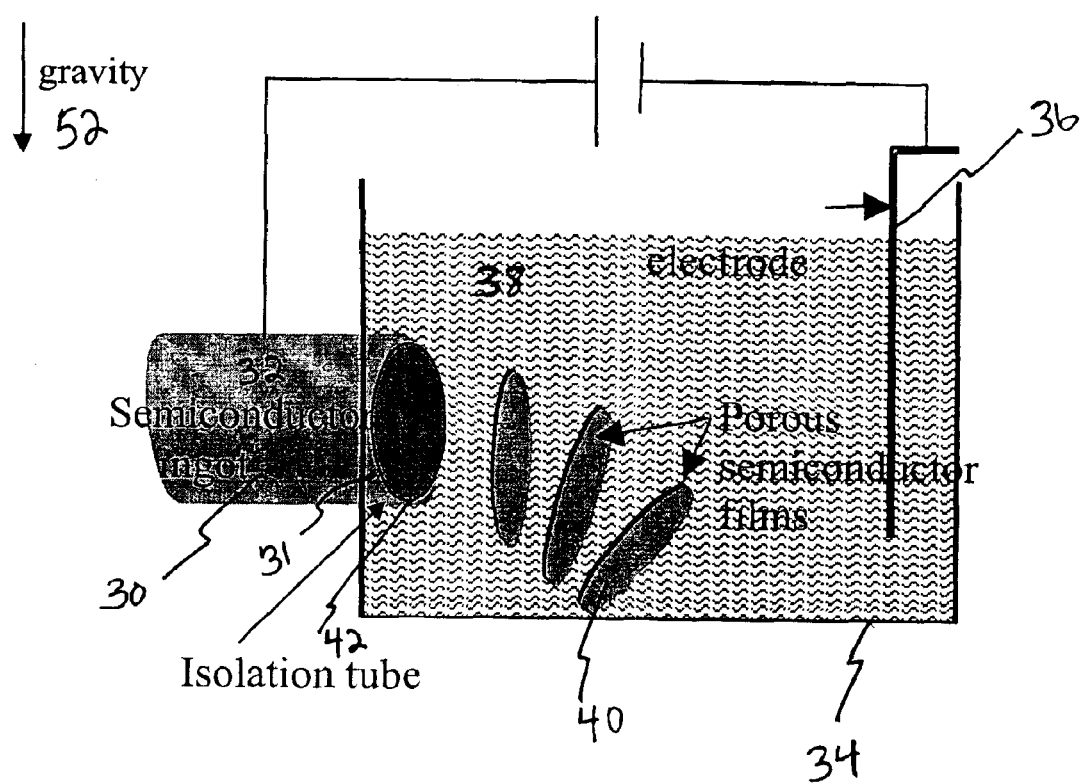
FIG. 6 illustrates a continuous production of thin semiconductor films from a silicon ingot by repetition in accordance with one embodiment of the invention.
Figure 9:
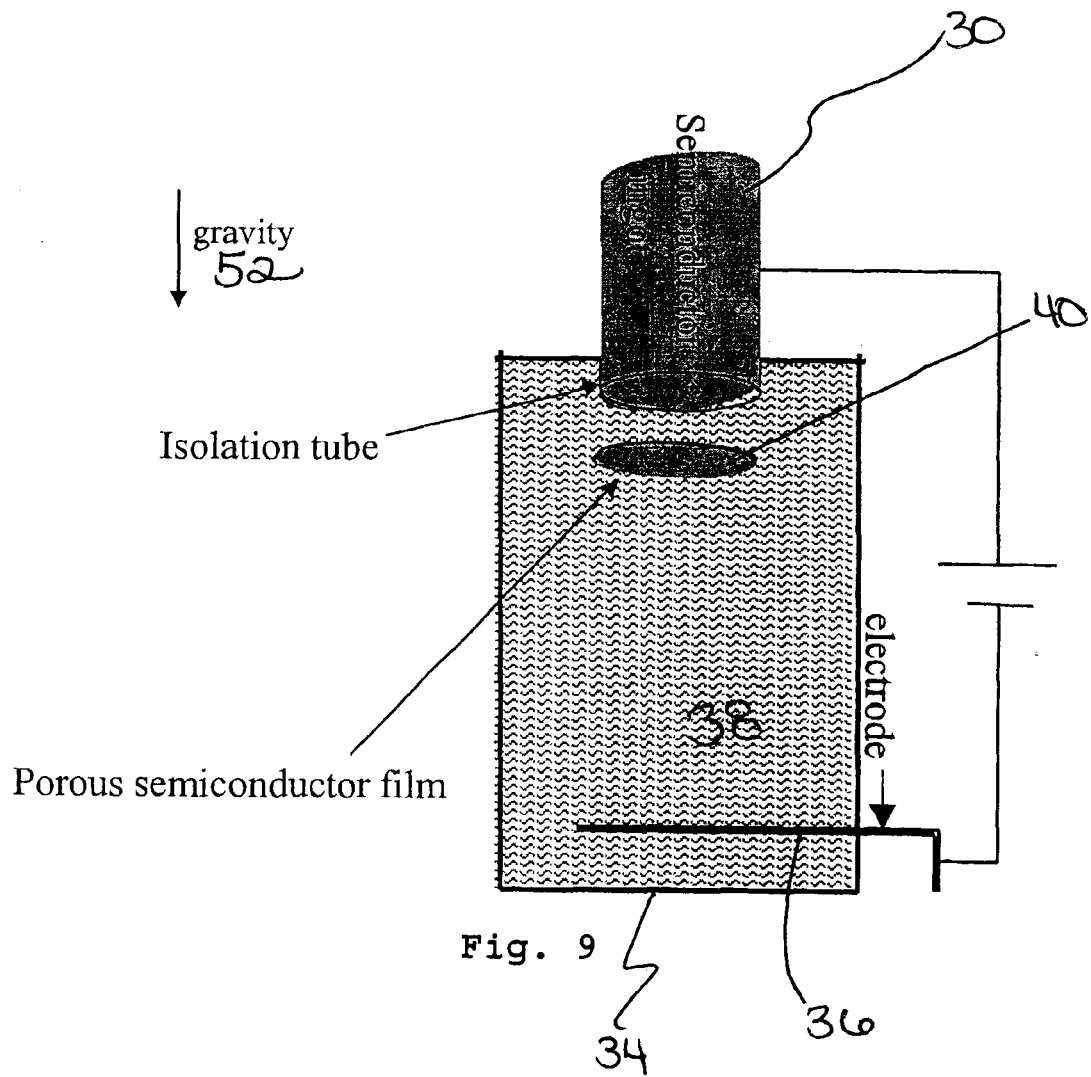
FIG. 9 illustrates continuous production of thin semiconductor films from a silicon ingot by repetition in accordance with another embodiment of the invention.

An apparatus for continuous production of thin films is depicted in FIG. 6. An ingot 30 comprises a semiconductor material 32, preferably silicon. The ingot 30 slides into a container 34 and a voltage potential is applied between the ingot 30 and an electrode 36 essentially situated inside the container 34, which is filled with an HF solution 38. This can be done in a controlled way such that the speed at which the ingot 30 is introduced into the HF bath is substantially synchronised with the lift off rate of the thin films 40, which may be a function of the current and the concentration of HF in the solution 38. This can also be done in a controlled way by, for instance, sensing the lift-off of a layer and automatically introducing another piece of ingot 30 into the HF solution 38 in the container 34, corresponding to the desired layer thickness. It is desirable to have the side surface 31 of the ingot 30 be as much as possible preserved from contact with the HF solution 38, which can be achieved by letting the ingot 30 slide into the container via an isolation tube 42, which protects it from HF on the side surface 31 see, e.g., FIG. 6 and FIG. 9). The 'isolation tube' 42 is defined by the function of preserving the ingot 30 from contact with the HF solution 38 and possibly guiding the ingot 30.

Figure 7:
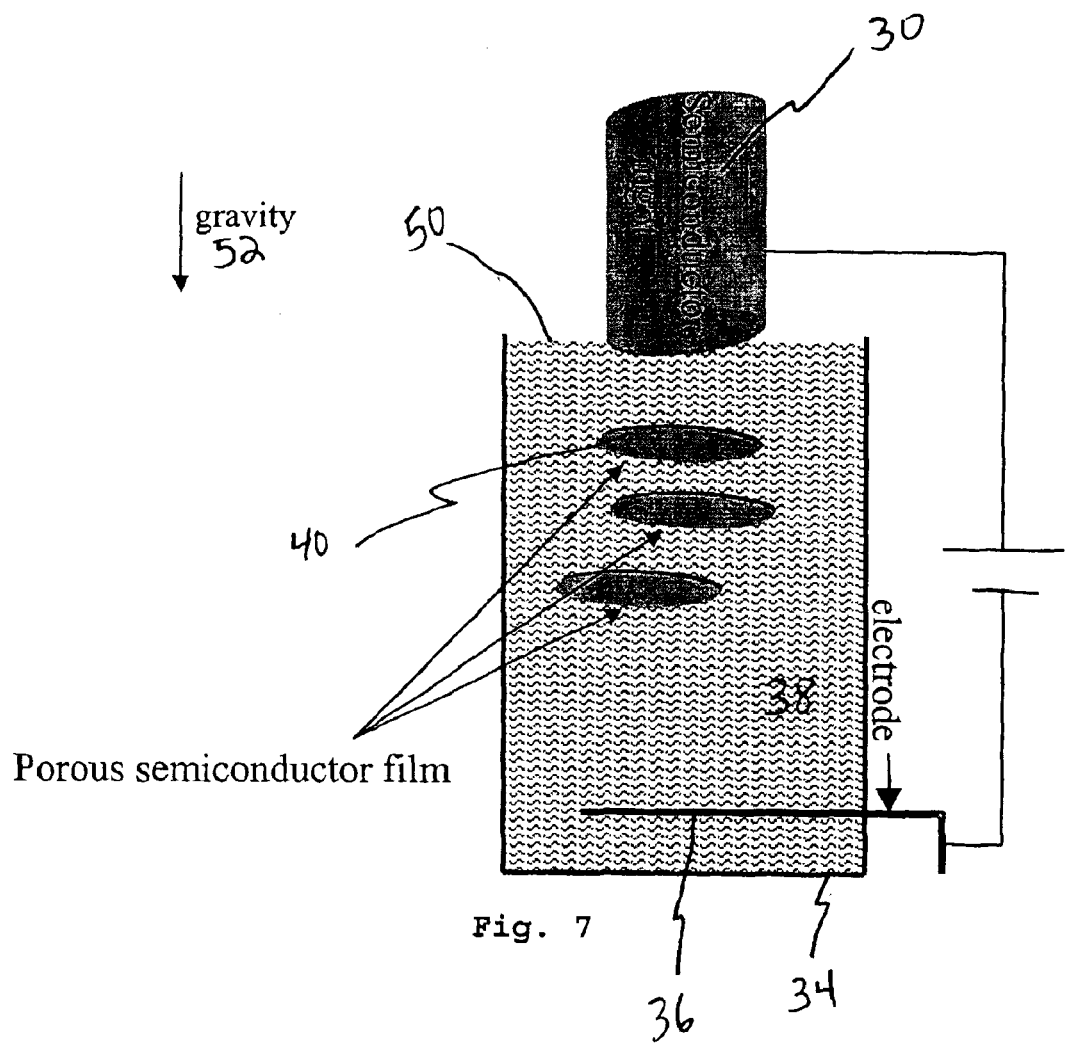
FIG. 7 illustrates continuous production of thin semiconductor films from a silicon ingot by repetition in accordance with another embodiment of the invention.

Another apparatus for the continuous production of thin film is depicted in FIG. 7, similar to the one of FIG. 6. Here the ingot 30 is introduced into the HF bath from the top surface 50, such that the lifted off films 40 are automatically removed from the ingot 30 caused by the force of downward gravity 52, thereby allowing the formation of the next film.

Figure 8:
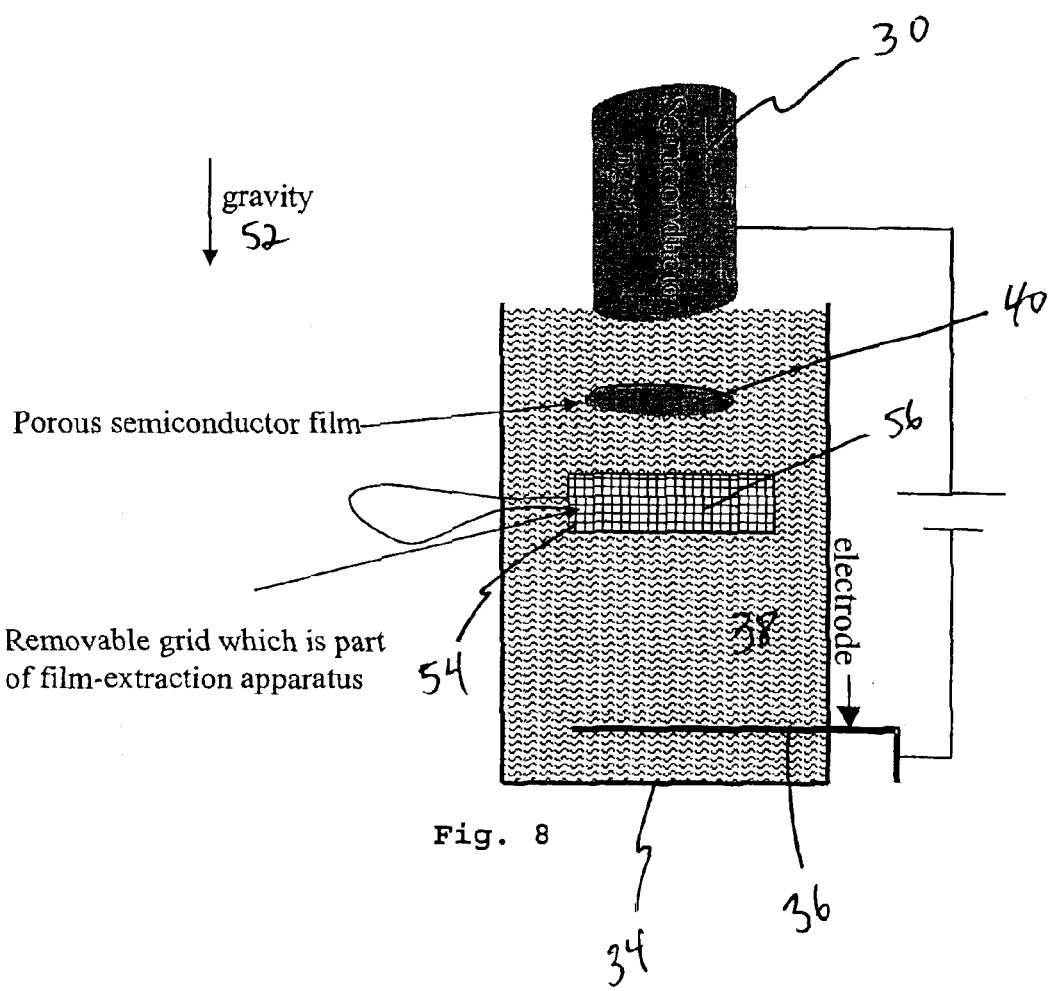
FIG. 8 illustrates continuous production of thin semiconductor films from a silicon ingot by repetition in accordance with yet another embodiment of the invention.

Additionally an extraction apparatus 54 can be inserted in the apparatus as mentioned above, the apparatus comprising a grid 56 comprising an appropriate material (see FIG. 8).

The grid 56 may be positioned under the lift-off area and used to catch the lifted off layers or thin films 40. After catching at least one (1) layer, but possibly more than one layer, the extraction apparatus 54 may be removed from the container 34 and the thin film or films 40 can be put into further processing. The porous thin film layers 40 may be annealed before further processing. The grid 56 may be made out of a material such that it does not or only slightly influence the anodic current, such that it does not interact with the thin film material and such that it does not stick to the grid 56.

In one embodiment, the container 34 may be attached to a circulation system, which keeps the HF concentration in the container 34 at a desired, preferably constant, level.

In one embodiment, the anode current applied between the ingot 30 and the electrode 36 does not vary substantially and is essentially constant during the processing of the entire ingot 30. The resistance of the ingot 30 can stay essentially constant during the processing of the full ingot 30, since the ingot 30 is typically conductive.

The grid 56 of the extraction apparatus 54 may contain a sensor to indicate the presence of one or more thin films on the grid 56.

The speed at which the ingot 30 is introduced into the HF bath may be substantially synchronised with the lift off rate of the thin films 40, which may be a function of the current and the concentration of HF in the solution.

The layer thickness of the lifted off layers 40 may be a function of the anode current and the concentration of HF in the solution 38.

What is claimed is:

1. A method of slicing a semiconductor substrate, the method comprising the steps of:
    applying N times, where N is a finite number, the steps of:
        etching a surface of said semiconductor substrate with a time dependent concentration of fluorine ions $F^-(t)$, and a time dependent current I, $I(t)$, ($[F^-, I]_i(t)$, $i=1,2,\ldots,N$) wherein 'i' identifies a porous layer, until a porous layer having surface roughness SR(i) is formed and said porous layer is separated from said substrate;
        removing the separated porous layer i from the surface of said substrate, wherein SR(i) is maintained below a desired threshold level.

2. The method according to claim 1, where $[F^-]_i(t)$ is substantially constant during etching.

3. The method according to claim 1, where $[I]_i(t)$ is substantially constant during etching.

4. The method according to claim 1, wherein N=1 or 2.

5. The method according to claim 1, wherein an initial semiconductor substrate surface is flat and the value of surface roughness of a subsequently separated porous layers remains within a desirable range for i>3.

6. The method according to claim 1, wherein said semiconductor substrate comprises a silicon substrate.

7. The method according to claim 1, wherein said semiconductor substrate comprises a semiconductor ingot.

8. An apparatus for slicing a semiconductor substrate, comprising:
    a container comprising at least one of first, second, third, and fourth holes;
    an etching solution contained within said container;
    an isolating material configured to protect at least a portion of said semiconductor substrate from said etching solution upon insertion into said container through said first hole and after exposing said substrate to said etching solution;
    a controller configured to regulate insertion of said semiconductor substrate into said container and said etching solution;
    an extractor configured to remove a separated layer from said container via said second hole;
    a first electrode connected to an unexposed portion of said substrate;
    a second electrode located in said etching solution; and
    a voltage source configured to apply a voltage between said first and second electrodes.

9. The apparatus of claim 8, further comprising a flow controller configured to provide a desirable concentration of said etchant in said etching solution by transferring etching solution into said container via said third hole and removing etchant solution from said container via said fourth hole.

10. The apparatus of claim 8, further comprising a detector configured to detect removal of porous layers front said substrate.

11. The apparatus of claim 8, wherein the isolating material comprises a tube within which the semiconductor substrate is inserted.

12. An apparatus for slicing a semiconductor substrate, comprising:

means for containing an etching solution;

means for protecting at least a portion of said semiconductor substrate from said etching solution upon insertion into a container through a first hole and after exposing said substrate to said etching solution;

means for controlling rate of insertion of said semiconductor substrate into said containing means and said etching solution;

means for removing a separated layer from said container via a second hole;

means for applying a voltage between first and second electrodes, the first electrode being connected to an unexposed portion of said substrate, and the second electrode being located in said etching solution.

13. The apparatus of claim 12, further comprising means for controlling concentration of said etchant in said etching solution by transferring etching solution into said container via a third hole and removing etchant solution from said container via a fourth hole.

14. The apparatus of claim 12, further comprising means for detecting removal of porous layers from said substrate.

15. The apparatus of claim 12, wherein the protection means comprises a tube within which the semiconductor substrate is inserted.

16. A method of slicing a semiconductor substrate, the method comprising:

applying a time-dependent current to a surface of the semiconductor substrate that is immersed in a solution having a controlled concentration of fluorine ions;

separating a layer from the semiconductor substrate in response to the application of the time-dependent current for a period of time; and repeating the applying and separating steps using the same values of time-dependent current and concentration of fluorine ions.

17. The method according to claim 16, where the concentration of fluorine ions is controlled to be substantially constant during the application of the time-dependent current.

18. The method according to claim 16, where the current value is substantially constant during the application of the time-dependent current.

19. The method according to claim 16, wherein the repeating step is performed until the roughness of a surface of the separated layer converges to a predetermined level.

20. The method according to claim 16, wherein said semiconductor substrate comprises a silicon substrate.

21. The method according to claim 16, wherein said semiconductor substrate comprises a semiconductor ingot.

* * * * *

UNITED STATES PATENT AND TRADEMARK OFFICE
CERTIFICATE OF CORRECTION

| | | |
|---|---|---|
| PATENT NO. | : 6,964,732 B2 | Page 1 of 1 |
| APPLICATION NO. | : 10/670754 | |
| DATED | : November 15, 2005 | |
| INVENTOR(S) | : Solanki | |

It is certified that error appears in the above-identified patent and that said Letters Patent is hereby corrected as shown below:

At page 2, column 2, line 7 under "Other Publications", please delete, "IIouse" and insert therefore, --House--.

At column 3, line 58, please delete, "F-" and insert therefore --F$^-$--

At column 4, line 5, please delete, "Embodiment(s)" and insert therefore, --Embodiments--.

At column 4, line 9, please delete, "electrocheniical" and insert therefore, --electrochemical--.

At column 10, line 30, please delete, "layers" and insert therefore, --layer--.

At column 10, line 63, please delete, "front" and insert therefore, --from--.

Signed and Sealed this

Twenty-fifth Day of July, 2006

JON W. DUDAS
*Director of the United States Patent and Trademark Office*